(12) United States Patent
Porter et al.

(10) Patent No.: US 6,275,409 B1
(45) Date of Patent: *Aug. 14, 2001

(54) METHODS OF OPERATING A DYNAMIC RANDOM ACCESS MEMORY

(75) Inventors: Stephen R. Porter; George B. Raad; Stephen L. Casper, all of Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/293,027

(22) Filed: Apr. 16, 1999

Related U.S. Application Data

(63) Continuation of application No. 08/878,657, filed on Jun. 19, 1997, now Pat. No. 5,901,078.

(51) Int. Cl.⁷ .................................................. G11C 11/24
(52) U.S. Cl. ............................ 365/149; 365/205; 365/207
(58) Field of Search ............................... 365/149, 205, 365/207, 189.01

(56) References Cited

U.S. PATENT DOCUMENTS

| | | | |
|---|---|---|---|
| 5,301,160 | 4/1994 | McAdams | 365/226 |
| 5,305,261 * | 4/1994 | Furutani et al. | 365/207 X |
| 5,311,478 | 5/1994 | Zagar et al. | 365/230.06 |
| 5,369,620 * | 11/1994 | Sugibayashi | 365/189.01 X |
| 5,369,622 | 11/1994 | McLaury | 365/233 |
| 5,418,753 | 5/1995 | Seki | 365/222 |
| 5,444,662 | 8/1995 | Tanaka et al. | 365/203 |
| 5,506,811 | 4/1996 | McLaury | 365/233 |
| 5,553,028 | 9/1996 | McLaury | 365/205 |
| 5,574,681 | 11/1996 | Foss et al. | 365/149 |
| 5,612,912 | 3/1997 | Gillingham | 365/168 |
| 5,623,446 | 4/1997 | Hisada et al. | 365/189.11 |

FOREIGN PATENT DOCUMENTS 0595747   5/1994   (EP) .

* cited by examiner

*Primary Examiner*—Huan Hoang
(74) *Attorney, Agent, or Firm*—Schwegman, Lundberg, Woessner & Kluth, P.A.

(57) ABSTRACT

A variable voltage is provided to gates of isolation transistors in DRAM devices between digit lines containing many storage cells and a sense amplifier. The gate of the isolation transistor is provided a voltage pumped higher than the supply voltage during read time to ensure that a small differential voltage on the digit lines is correctly read. A lower voltage is provided at sense time such that the isolation gate provides a higher resistance during sense time. During restore time, the isolation gate voltage is again raised above the operating voltage to minimize the effects of isolation transistor threshold voltage, Vt. In further embodiments, the higher voltage is only provided during restore time and the read and sense voltages are varied between the higher and lower voltage.

22 Claims, 3 Drawing Sheets

METHODS OF OPERATING A DYNAMIC RANDOM ACCESS MEMORY

This application is a continuation of 08/878,657, filed Jun. 19, 1997, U.S. Pat. No. 5,901,078.

FIELD OF THE INVENTION

The present invention relates to semiconductor based memory devices, and in particular to sense amplifier isolation gates.

BACKGROUND OF THE INVENTION

Semiconductor memory devices contain memory cells for storing small electrical charges representative of bits of data. As storage densities are increasing, the cells, and circuitry used to access, sense and restore bits stored in the cells are becoming smaller and smaller. Sense amplifiers are used to detect and amplify the charges stored in the cells. As the size of the memory devices decrease, the charge to be detected decreases. In addition, the power supply voltages at which DRAMs operate are also decreasing to reduce the power consumption of the DRAMs. The lower power supply voltages, lead to slower circuit operations, or in some cases where transistors have relatively high threshold voltages, improper operation.

Isolation gates are used to connect digit lines coupled to multiple memory cells to sense amplifiers. In normal operation, the isolation gates selectively turned on and off during read, sense and restore cycles. First, the isolation gates are coupled to the power supply Vcc during initially accessing charges from a memory cell. In most cases, they are left on during sensing, but sometimes they have been turned off by coupling the gates to ground during sensing. Finally, the isolation gates are coupled to Vcc during restore to turn them back on. As Vcc decreases, the threshold voltage, Vt, of the isolation gates becomes relatively large, and affects the ability of the sense amplifiers to sense the charge stored on the cells. The threshold voltage is not easily scalable. Further, high Vt relative to Vcc can affect the ability to restore the sensed cell due to significant resistance presented by the isolation gate. Some prior attempts to solve this problem on restore resulted in a pumped Vcc, Vccp, being applied to the isolation gates to reduce this resistance as seen in an IEEE paper entitled "Low Voltage High Speed Circuit Designs for Giga-bit DRAMs" by Lee et al., Symposium on VLSI Circuits Digest of Technical Papers, 1996, pp 104,105.

There is a need for accurate reading of memory cells in DRAM devices. There is a further need for better detection of voltage differences on digit lines during access operations, especially when the supply voltage of the DRAM is decreased. There is yet a further need for faster accessing, sensing and restoring of memory cells in DRAM devices.

SUMMARY OF THE INVENTION

A variable voltage is provided to gates of isolation transistors in DRAM devices between digit lines containing many storage cells and a sense amplifier. The gate of the isolation transistor is provided a voltage higher than the supply voltage during access time to ensure that a small differential voltage on the digit lines is correctly detected. A lower voltage is provided at sense time such that the isolation gate provides a higher resistance during sense time. In a further embodiment, during restore time, the isolation gate voltage is again raised above the supply voltage to minimize the effects of isolation transistor threshold voltage, Vt. This provides the ability to eliminate a Vt drop at access and restore times while providing better isolation of the digit lines when the sense amplifier fires.

In one embodiment, the voltage on the isolation gate is increased greater than Vt above Vcc at access time to Vccp, and then decreased during sense time to provide some amount of isolation from the digit lines. This provides for a faster driving of the isolated portions of the digit lines to Vcc and ground by the sense amplifiers.

In a further embodiment, the voltage on the isolation gate is increased to Vccp both during access time and during restore time to reduce adverse effects of Vt drops.

In yet a further embodiment, the isolation gate voltage during access time is dropped below Vcc. In one embodiment, it is dropped to ground.

In yet a further embodiment, the voltage on the isolation gate is held at Vcc for both access and sense, and then increased to Vccp during restore time. A typical value for Vcc is 2.5 volts, and for Vccp is 4.0 volts. When Vt is almost 1 volt, and the digit or bit lines are equilibrated at 1.25 volts, Vt of the isolation gates adversely affects accurate sensing of the digit lines. Even further reductions in Vcc exacerbate the problem. By increasing the voltage of the isolation gates above Vcc at selected times, sensing accuracy is greatly improved, and restore operations are enhanced. In addition, reducing the isolation gate voltage during read time helps speed the driving of the sense amplifier lines to Vcc and ground by providing increased resistance or isolation between the sense amplifiers and the digit lines.

DESCRIPTION OF THE EMBODIMENTS

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized and that structural, logical and electrical changes may be made without departing from the spirit and scope of the present invention. The following detailed description is, therefore, not to be taken in a limiting sense, and the scope of the present invention is defined by the appended claims.

Figure 1:
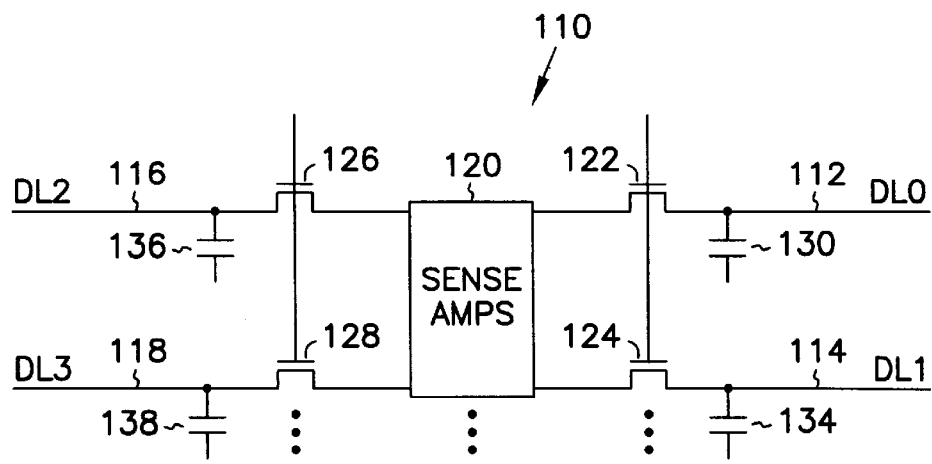
FIG. 1 is a block schematic diagram of DRAM digit lines coupled to shared sense amplifiers.

A dynamic random access memory DRAM array is shown generally at 110 in FIG. 1. Digit lines 112, 114, 116, and 118 are labeled DL0, DL1, DL2 and DL3 respectively. Each digit line represents and is coupled to a large number of memory cells, and also is coupled to a bank of p and n sense amplifiers 120 through isolation transistors indicated at 122, 124, 126 and 128. The isolation transistors have been used in the past to isolate the sense amplifiers from digit line parasitic capacitance as represented at 130, 132, 134 and 136. The parasitic capacitance of each line becomes relatively more significant as higher density, lower voltage, DRAMs are developed, and can significantly delay proper accessing, sensing and restoring of the digit lines. In the present invention, the isolation transistors are driven by a variable voltage during different portions of accessing, sensing and restoring memory cells coupled to the digit lines. In further embodiments, the DRAM of FIG. 1 is representative of multiple subarrays of rows of memory cells sharing multiple sense amplifiers.

Figure 2:
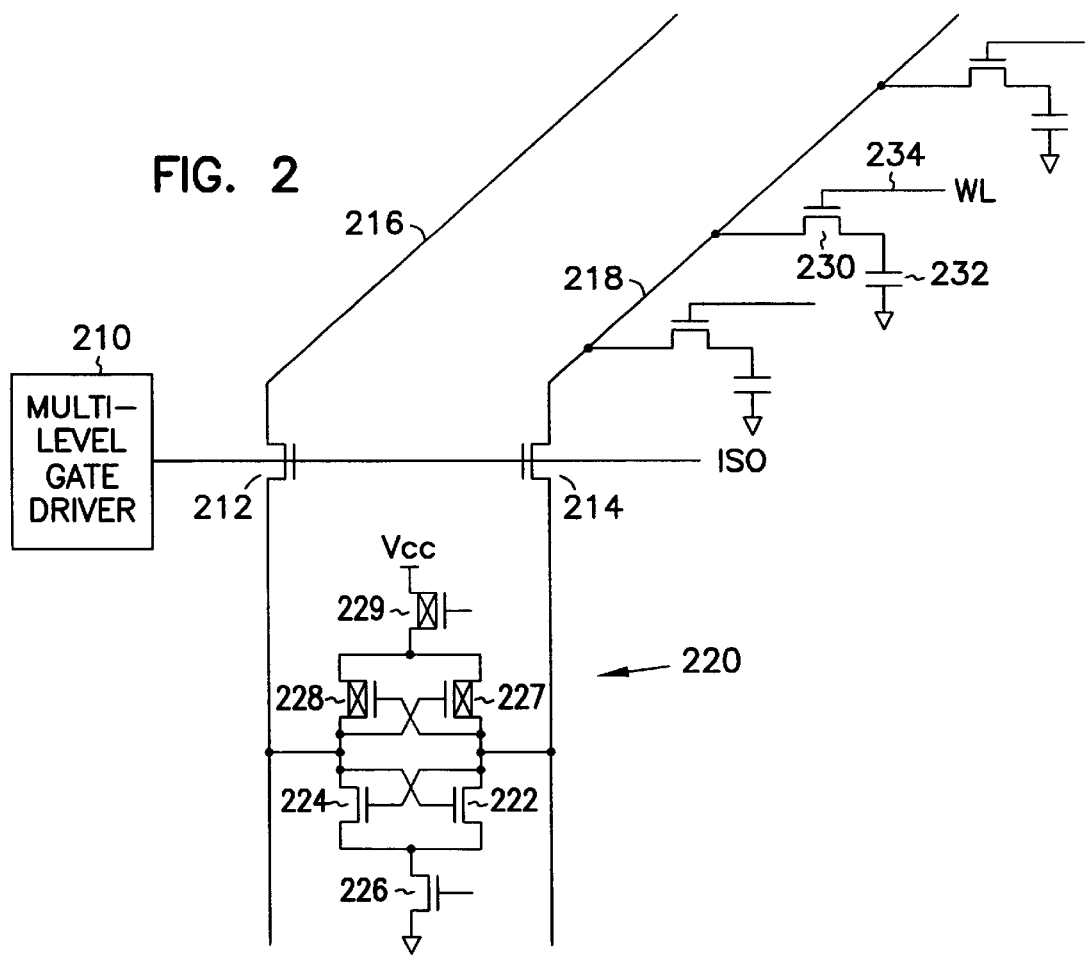
FIG. 2 is a block schematic diagram of a pair of DRAM digit lines coupled to an n-sense amplifier.

Further detail of a portion of the DRAM array is shown in FIG. 2. A multilevel gate driver is shown in block form at 210. Drivers which are capable of generating different voltage levels are known in the art and hence multilevel gate driver 210 is shown in block format. Multilevel gate driver 210 is coupled to gates of two isolation transistors 212 and 214 which are coupled to a pair of digit lines 216 and 218 respectively. The digit lines are in turn coupled through the isolation transistors to an n-sense amplifier and p-sense amplifier indicated generally at 220. The n-sense amplifier comprises a pair of cross coupled n-channel transistors 222 and 224 coupled to a transistor 226. The p-sense amplifier comprises a pair of cross coupled p-channel transistors 227 and 228 coupled to a transistor 229. Digit line 218 is also coupled to multiple memory cells, one of which comprises an access transistor 230 series coupled to a storage capacitor 232 which holds a charge representative of desired data. A gate of the access transistor 230 is coupled to a word line indicated at 234 which is used to couple the storage capacitor 232 to the digit line. Multiple different word lines are shown in FIG. 2, such that firing of one word line only provides the charge from one storage capacitor on the digit line. Digit line 216 is also coupled to many memory cells which are also coupled to the word lines, forming rows of memory cells. In this embodiment, digit line 216 is used as a reference, and the difference in voltage of the two digit lines is detected and then amplified or sensed by the n-sense amplifier 220.

Figure 3:
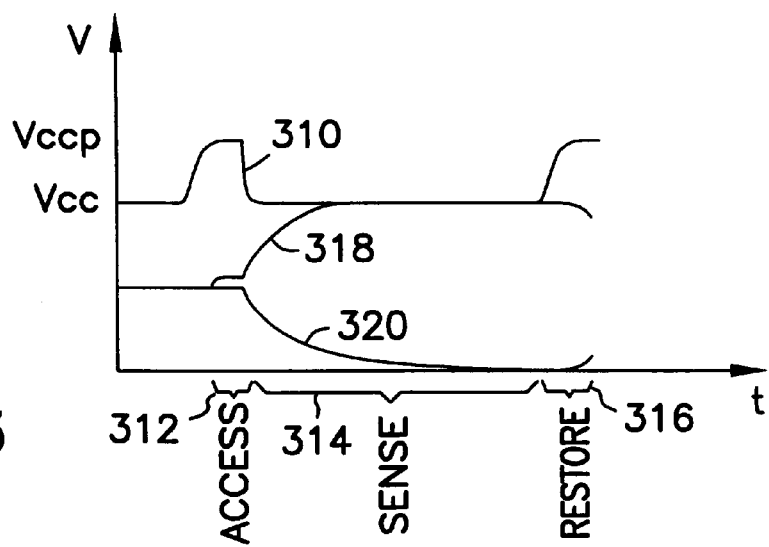
FIG. 3 is a timing diagram of voltages applied to gates of isolation transistors in the diagram of FIG. 2.

Isolation gate control signals and digit line voltages are shown in FIG. 3 in one embodiment of the invention as voltage versus time. The isolation gate voltage in this embodiment is varied from a first reference voltage, such as an array power supply voltage, Vcc to a higher, second reference voltage such as a pumped array power supply voltage Vccp. Vccp in one embodiment is Vcc plus an amount higher than the threshold voltage, Vt, of n-channel transistors formed on the DRAM. In one embodiment, Vcc is 2.0 volts, and Vccp is 3.1 volts or higher where the Vt is 1.0 volts. In a further embodiment, Vcc is 2.5 volts, and Vccp is 4.0 volts to provide a significant increase compared to a Vt of 1.0 volts. In FIG. 3, the isolation gate voltage provided by the multilevel gate driver 210 is shown at 310. It is varied between Vcc and Vccp as data is accessed at a time interval 312, sensed at a time interval 314 and restored during a time interval 316. Digit line voltages are indicated at 318 and 320 where a positive charge is read on storage capacitor 232. As seen in FIG. 3, the isolation gate voltage is at Vcc prior to read 312. During access 312, the isolation gate voltage 310 is raised to Vccp, and then lowered to Vcc during the sensing interval 314. Finally, during restore 316, the isolation gate voltage is again raised to Vccp.

With relatively high Vt, it becomes more difficult to differentiate between the high and low digit lines, especially where the digit lines are biased to Vcc/2, which is very common in high density DRAMs. Essentially, with the isolation gate held at Vcc, the isolation transistors tend to present a significant resistance between the storage cell and the sense amp, reducing the difference in voltage on the digit lines induced by the charge stored on the storage cell. In addition, with even lower Vcc in new DRAMs, the isolation transistor does not adequately turn on because of the relatively large Vt. When reading a "1" from a storage cell, the charge may be insufficient to overcome an increased resistance of the isolation transistor, further leading to unreliable sensing. By using a pumped power supply voltage, Vccp, the isolation transistors turn on better and become much more conductive and Vt becomes relatively small with respect to the pumped power supply voltage, allowing the difference in voltage on the digit lines to be reliably detected by the sense amplifiers. Since the isolation gates still present significant resistance at Vcc, it is not necessary to drop the gates down to zero volts as in the prior art during the sensing interval. In other words, there is sufficient gain in the sense amplifier to drive to full rails of Vcc and zero volts due to such resistance combined with the parasitic capacitance of the digit lines. Finally, during the restore interval, raising the isolation gate voltage to Vccp again turns on the isolation gate fully, reducing its resistance and allowing the storage capacitor 232 to be properly written.

Figure 4:
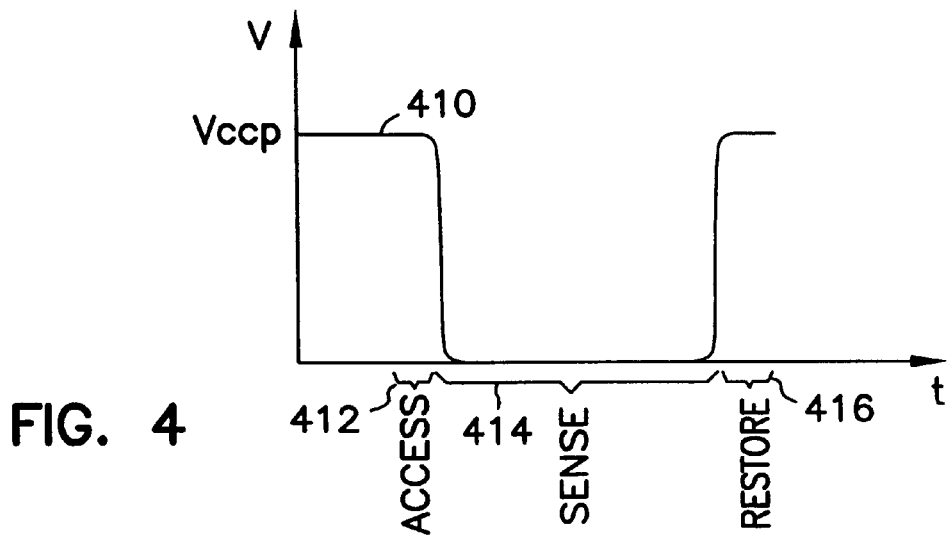
FIG. 4 is a timing diagram of voltages applied to gates of isolation transistors in the diagram of FIG. 2 in a further embodiment.

A further embodiment of the invention is illustrated in the voltage versus time diagram of FIG. 4. For simplicity, only the isolation gate voltage 410 is shown. The same time intervals of access, 412, sense, 414 and restore 416 are also shown. In this embodiment, both the isolation gate voltage is held at a desired reference voltage, such as Vccp during access 412 and restore 416 intervals, but is brought to zero or near zero volts during the sensing operation to fully isolate the digit lines from the sense amplifier. This allows the sense amplifier to more quickly drive to full rail, which allows data to be transferred to I/O lines more quickly, improving the speed at which data is accessed. Similar benefits during the access and sense intervals are obtained as in the embodiment of FIG. 3, along with the benefits during the restore interval 416.

Figure 5:
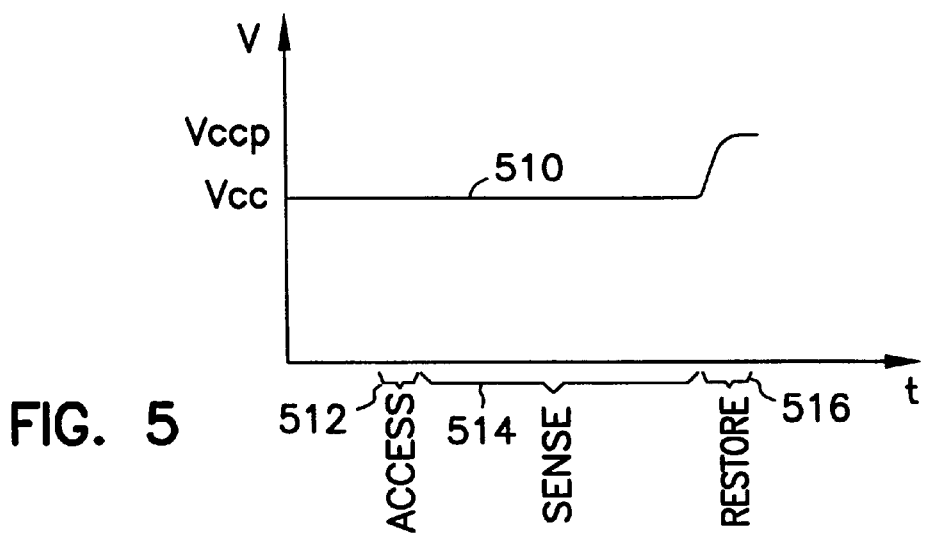
FIG. 5 is a timing diagram of voltages applied to gates of isolation transistors in the diagram of FIG. 2 in still a further embodiment.

Yet a further embodiment of the present invention is illustrated in FIG. 5. Again, only the isolation gate voltage 510 is shown, and the same time intervals of access, 512, sense, 514 and restore 516 are shown. In this embodiment, the isolation gate voltage is held fairly constant at the first reference voltage Vcc during the access 512 and sense 514 intervals. Then, during restore, the isolation gate voltage is rapidly ramped up to the second reference voltage Vccp to more quickly perform the restore operation by lowering the resistance provided by the isolation gates as in the previous embodiments. In this case, however, since the voltage during the sense interval is already at Vcc, less time is required to ramp up the isolation gate voltage 510 to Vccp. This allows the restore operation to complete more quickly.

Figure 6:
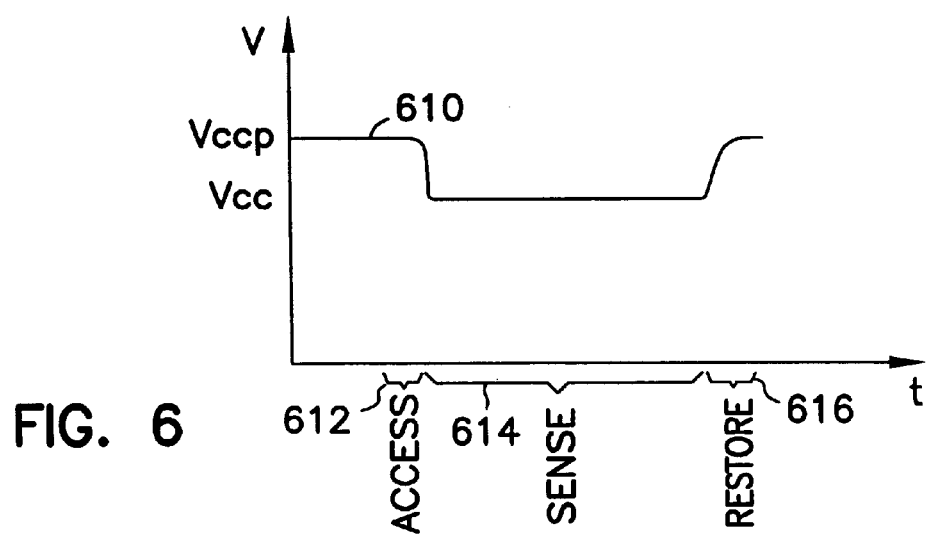
FIG. 6 is a timing diagram of voltages applied to gates of isolation transistors in the diagram of FIG. 2 in still a further embodiment.

A further embodiment of the invention is illustrated in the voltage versus time diagram of FIG. 6. For simplicity, only the isolation gate voltage 610 is shown. The same time intervals of access, 612, sense, 614 and restore 616 are also shown. In this embodiment, the isolation gate voltage is held at the second reference voltage before and during access 612 and during restore 616 intervals, but is brought to the first reference voltage during the sensing operation to provide increased resistance between the sense amplifiers and the digit lines. This allows the sense amplifier to more quickly drive to full rail, improving the speed at which data is read. In addition, it takes less time to change the power supply voltage levels applied. Similar benefits during the access and sense intervals are obtained as in the embodiment of FIG. 3, along with the benefits during the restore interval 416. In further variations of FIG. 6, the first reference voltage during the sense interval 614 may be any voltage between Vcc and zero, or perhaps less than zero if desired. It should serve to increase the resistance or isolation provided by the isolation gates.

It is to be understood that the above description is intended to be illustrative, and not restrictive. Many other embodiments will be apparent to those of skill in the art upon reviewing the above description. While the power supply voltage and threshold voltages were described as explicit values, memory devices having other supply and threshold voltages will also benefit from the various embodiments of the present invention. One range of Vcc is between approximately 1.5 and 2.5 volts. The second reference voltage, Vccp, was described as a voltage higher than the first reference voltage by more than Vt. This need not be the case. The higher, second reference voltage could also be less than Vt above the supply voltage and at least some of the benefits of significantly affecting the resistance of the isolation gates as compared to their resistance at a gate voltage of Vcc will be obtained. Such variations will be obvious to one skilled in the art upon review of the present description.

What is claimed is:

1. A method of operating a DRAM (Dynamic Random Access Memory) having multiple rows of memory cells coupled to digit lines which in turn are coupled to sense amplifiers through isolation transistors having gates controlled by an isolation gate voltage, the method comprising:

raising an isolation gate voltage above an array supply voltage when firing a row of memory cells, while maintaining substantially all other signal voltages at or below the array supply voltage;

lowering the isolation gate voltage during sensing of the digit lines; and raising the isolation gate voltage above the array supply voltage while restoring the memory cell, while maintaining substantially all other signal voltages at or below the array supply voltage.

2. The method of claim 1, wherein the isolation gate has a threshold voltage, and the isolation gate voltage is raised at least approximately greater than one threshold voltage above the array supply voltage when firing a row of memory cells.

3. The method of claim 1, wherein the isolation gate operates as a resistor during sensing of the digit lines to provide isolation of the digit lines.

4. The method of claim 1, wherein the array supply voltage is not higher than approximately 2.5 volts.

5. The method of claim 1, wherein the method is performed in the order presented.

6. A method of operating a DRAM (Dynamic Random Access Memory) having multiple rows of memory cells coupled to digit lines which in turn are coupled to sense amplifiers through isolation transistors having a threshold voltage and having gates controlled by an isolation gate voltage, the method comprising:

firing a row of memory cells to create a differential voltage on two digit lines coupled to the sense amplifiers through the isolation gate, wherein the isolation gate voltage is held approximately at a first reference voltage;

reading the digit lines while keeping the isolation gate voltage at approximately the first reference voltage; and raising the isolation gate voltage above the first reference voltage by at least approximately the amount of the threshold voltage while restoring the memory cell.

7. The method of claim 6, wherein the isolation gate operates as a resistor during sensing of the digit lines to provide isolation of the digit lines.

8. The method of claim 6, wherein the first reference voltage is not higher than approximately 2.5 volts and the threshold voltage is approximately 1.0 volts.

9. The method of claim 6, wherein the method is performed in the order presented.

10. A method of operating a DRAM (Dynamic Random Access Memory) having multiple rows of memory cells coupled to digit lines which in turn are coupled to sense amplifiers through isolation transistors having gates controlled by an isolation gate voltage, the method comprising:

holding an isolation gate voltage at approximately a first reference voltage when firing a row of memory cells;

holding the isolation gate voltage at approximately the first reference voltage during sensing of the digit lines; and raising the isolation gate voltage above the first reference voltage by at least approximately the amount of the threshold voltage while restoring the memory cell.

11. The method of claim 10, wherein the method is performed in the order presented.

12. A method of operating a DRAM (Dynamic Random Access Memory), the method comprising:

raising an isolation gate voltage above an array supply voltage when firing a row of memory cells of multiple rows of memory cells of the DRAM, while maintaining substantially all other signal voltages at or below the array supply voltage, wherein the isolation gate voltage controls gates of a number of isolation transistors of the DRAM such that the number of isolation transistors couple digit lines of the DRAM to sense amplifiers of the DRAM, the digit lines coupled to the multiple rows of memory cells;

lowering the isolation gate voltage during sensing of the digit lines; and raising the isolation gate voltage above the array supply voltage while restoring a memory cell of the DRAM, while maintaining substantially all other signal voltages at or below the array supply voltage.

13. The method of claim 12, wherein the isolation gate has a threshold voltage, and the isolation gate voltage is raised at least approximately greater than one threshold voltage above the array supply voltage when firing the row of memory cells.

14. The method of claim 12, wherein the isolation gate operates as a resistor during sensing of the digit lines to provide isolation of the digit lines.

15. The method of claim 12, wherein the array supply voltage is not higher than approximately 2.5 volts.

16. The method of claim 12, wherein the method is performed in the order presented.

17. A method of operating a DRAM (Dynamic Random Access Memory), the method comprising:

firing a row of memory cells of multiple rows of memory cells of the DRAM, the multiple rows of memory cells coupled to digit lines, to create a differential voltage on two digit lines coupled to sense amplifiers through isolation transistors on the DRAM, the isolation transistors having a threshold voltage and gates controlled by an isolation gate voltage, wherein the isolation gate voltage is held approximately at a first reference voltage;

reading the digit lines while keeping the isolation gate voltage at approximately the first reference voltage; and raising the isolation gate voltage above the first reference voltage by at least approximately the amount of the threshold voltage while restoring a memory cell.

18. The method of claim 17, wherein the isolation gate operates as a resistor during sensing of the digit lines to provide isolation of the digit lines.

19. The method of claim 17, wherein the first reference voltage is not higher than approximately 2.5 volts and the threshold voltage is approximately 1.0 volts.

20. The method of claim 17, wherein the method is performed in the order presented.

21. A method of operating a DRAM (Dynamic Random Access Memory), the method comprising:

holding an isolation gate voltage at approximately a first reference voltage when firing a row of memory cells of multiple rows of memory cells of the DRAM, the multiple rows of memory cells coupled to digit lines, wherein the isolation gate voltage controls gates of a number of isolation transistors of the DRAM, such that the number of isolation transistors have a threshold voltage and couple the digit lines to sense amplifiers on the DRAM;

holding the isolation gate voltage at approximately the first reference voltage during sensing of the digit lines; and raising the isolation gate voltage above the first reference voltage by at least approximately the amount of the threshold voltage while restoring a memory cell of the DRAM.

22. The method of claim 21, wherein the method is performed in the order presented.

* * * * *

UNITED STATES PATENT AND TRADEMARK OFFICE
CERTIFICATE OF CORRECTION

PATENT NO.   : 6,275,409 B1
DATED        : August 14, 2001
INVENTOR(S)  : Stephen R. Porter, George B. Raad and Stephen L. Casper It is certified that error appears in the above-identified patent and that said Letters Patent is hereby corrected as shown below:

Column 2,
Lines 14-15, the ¶ beginning with "In yet a further embodiment, the isolation gate voltage..." should be a part of the previous ¶ beginning with "In a further embodiment, the voltage on the isolation gate..."

Column 4,
Line 63, delete "at-the" and insert -- at the --, therefor.

Signed and Sealed this

Eleventh Day of June, 2002

Attest:

JAMES E. ROGAN
Attesting Officer   Director of the United States Patent and Trademark Office